United States Patent
Alers et al.

(10) Patent No.: US 6,559,499 B1
(45) Date of Patent: May 6, 2003

(54) PROCESS FOR FABRICATING AN INTEGRATED CIRCUIT DEVICE HAVING CAPACITORS WITH A MULTILEVEL METALLIZATION

(75) Inventors: Glenn B Alers, Santa Cruz, CA (US); Philip W Diodato, Asbury, NJ (US); Ruichen Liu, Warren, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/477,310

(22) Filed: Jan. 4, 2000

(51) Int. Cl.$^7$ ............................................. H01L 27/108
(52) U.S. Cl. .................. 257/311; 257/309; 257/310; 438/253; 438/396
(58) Field of Search .................. 257/306, 309, 257/310, 311; 438/253, 396

(56) References Cited

U.S. PATENT DOCUMENTS

| | | | | |
|---|---|---|---|---|
| 5,315,141 A | * | 5/1994 | Kim | 257/306 |
| 5,323,037 A | * | 6/1994 | Su | 257/306 |
| 5,479,316 A | | 12/1995 | Smrtic et al. | 361/322 |
| 5,686,339 A | * | 11/1997 | Lee et al. | 257/306 |
| 5,753,558 A | * | 5/1998 | Akram et al. | 438/386 |
| 5,792,687 A | * | 8/1998 | Jeng et al. | 438/253 |
| 5,926,359 A | | 7/1999 | Greco et al. | 361/311 |
| 6,174,770 B1 | * | 1/2001 | Chi | 438/255 |
| 6,376,874 B1 | * | 4/2002 | Kim | 257/306 |

FOREIGN PATENT DOCUMENTS

| | | | | |
|---|---|---|---|---|
| JP | 4-02-94554 | * | 4/1990 | 257/306 |
| JP | 4-04-106971 | * | 4/1992 | 257/296 |
| JP | 4-05-82731 | * | 4/1993 | 257/306 |

OTHER PUBLICATIONS

Nitayama et al., *IEEE*, "Future Directions for DRAM Memory Cell Technology", pp. 355–358, 1998.

* cited by examiner

*Primary Examiner*—George Eckert
(74) *Attorney, Agent, or Firm*—Richard J. Botos

(57) ABSTRACT

A process for fabricating trench capacitors in an interconnect layer of a semiconductor device is disclosed. In the process, at least one interconnect is formed in the interconnect layer, which is then planarized. To form the trench capacitor, a trench is formed in the dielectric material of the interconnect. The bottom of the trench communicates with a metal contact in the underlying layer. A barrier layer of material is formed on the interconnect layer and is anisotropically etched, leaving the barrier layer on the sidewalls of the trench. The lower plate of the capacitor is then formed by depositing a layer of metal over the interconnect layer. The layer of metal is then anisotropically etched, removing the metal on the surface of the interconnect layer and leaving the metal along the trench perimeter. The capacitor dielectric layer is then deposited over the interconnect layer and subsequently patterned. Another layer of barrier material is deposited on the interconnect layer. The metal for the top plate of the capacitor is then deposited over the interconnect layer. The top plate of the capacitor extends into the trench. The metal layer and barrier layer are then patterned to form the top plate of the capacitor.

9 Claims, 2 Drawing Sheets

PROCESS FOR FABRICATING AN INTEGRATED CIRCUIT DEVICE HAVING CAPACITORS WITH A MULTILEVEL METALLIZATION

BACKGROUND OF THE INVENTION

1. Technical Field

The present invention is directed to a process for fabricating an integrated circuit device with a multilevel interconnect structure that has capacitors in the multilevel interconnect structure.

2. Art Background

Dynamic random access memory (DRAM) relates to electronic devices consisting of cells which can retain information only for a limited time before they must be read and refreshed at periodic intervals. A typical DRAM cell consists of at least one transistor and a storage capacitor. In general, the integrated circuit used for DRAMs consists of metal oxide semiconductor (MOS) and particularly complementary MOS structure (CMOS) as the transistor component. Recently, the capacity of such DRAM structures has evolved from one megabit to on the order of one gigabit. This increase in memory has required the evolution of gate feature sizes on the order of 1.25 microns down to on the order of 0.25 microns or smaller. As the DRAM capacity requirements are increased, the requirements placed on the capacitors are increased as well. Not only is there a requirement for increased capacitance, there is also a requirement for decreased capacitor area. Accordingly, development efforts have been focused on materials and structures to meet this need.

To minimize interconnection resistance and to maximize the use of valuable chip area, advanced VLSI and ULSI logic integrated semiconductor circuits use multi-level wiring line structures for interconnecting regions within the devices and for interconnecting one or more devices within the integrated circuit. Multi-level metallization provides greater flexibility in circuit design, a reduction in die size and, thereby, a reduction in chip cost. In fabricating such structures, the conventional approach is to form lower level wiring lines (or interconnect structures) and then form one or more upper level wiring lines interconnected with the first level wiring lines. A first level interconnect structure may be in contact with the doped region within the substrate of an integrated circuit device (for example the source or drain of a typical MOSFET). One or more interconnections are typically formed between the first level interconnect and other portions of the integrated circuit device or to structures external to the integrated circuit device. This is accomplished through the second and subsequent levels of wiring lines. Conductive vias are used to make the connection from one level to another. Metal layer (M-1) at the first level is connected to the source formed in the substrate layer of the integrated circuit. This metal layer M-1 is used to make electrical connections at level one as well as at higher levels using the described via structure.

An embedded DRAM structure adds integrated capacitors to the logic transistors to add high density memory cells to the circuit. These integrated capacitors can be connected to the source metallization of the MOS device to form the memory cell. Conventional DRAM capacitors often have a layer of polycrystalline silicon (polysilicon hereinafter) as the bottom electrode; a layer of silicon dioxide or silicon nitride as the insulator; and a top metal or polysilicon layer forming the top electrode. Such a structure is generally not compatible with embedded DRAM technology because of the added complexity of the polysilicon capacitors and the high temperatures required to grow the silicon oxide/nitride layer. For example, the aluminum metal layers used as interconnects in the multi-layer structure can be adversely affected by the relatively high temperatures used in the deposition of polysilicon and the formation of associated capacitor oxides. Furthermore, the use of polysilicon as an electrode can have deleterious affects on the electrical characteristics of the device. To this end, it is known to use tantalum pentoxide as the dielectric of the capacitor because of its higher dielectric constant compared to silicon dioxide or silicon nitride. During the chemical vapor deposition used to form the tantalum pentoxide, a necessary barrier layer is formed between the polysilicon layer and the tantalum pentoxide layer to prevent reduction of the tantalum pentoxide, and the leakage current that would result. Frequently, this barrier layer is a dielectric material such as silicon nitride. Dielectric materials used for these barrier layers typically have a dielectric constant lower than that of tantalum pentoxide. As can be appreciated, such barrier layer materials are not desired in a capacitor, as they tend to adversely impact the capacitance of the capacitor.

Accordingly, it is advantageous if the bottom plate of the capacitor is not required to be polysilicon. If the capacitors are formed in the interconnect layer instead of the device layer, the bottom plate of the capacitor can be metal instead of polysilicon. A method of forming a trench capacitor in an interconnect layer is disclosed in U.S. Serial No. 60/115520 which was filed on Jan. 12, 1999 and is commonly assigned with the present application. U.S. Serial No. 60/115520 discloses a method that requires chemical mechanical polishing of the interconnect structure after the metal for the top plate of the capacitor is backfilled into the capacitor trench. Such a step is complex because it requires planarization of the entire interconnect structure (including all previously formed interconnects) after the trench capacitors are formed. The method also requires that a resist-etchback process be used to recess the lower electrode into the via to withstand the planarization process. Such a process is time-consuming in that it requires the formation of a photoresist layer than resides only in the lower portion of the trench to selectively process (i.e. etch, deposit, etc.) the barrier on the sidewalls of the via. As such, the photoresist layer is not deposited in the upper portion (i.e. about the upper twenty-five percent) of the trench or on the horizontal surface of the wafer. In any process for device fabrication, it is advantageous if the number of such steps is kept to a minimum.

Accordingly, methods for forming trench capacitors in an interconnect layer continue to be sought.

SUMMARY OF THE INVENTION

The present invention is directed to process for semiconductor device fabrication. In the process, a trench is first formed in a dielectric layer in which metal interconnects have previously been formed. This dielectric layer is referred to as the interconnect layer. The dielectric layer is formed over an underlying layer that is either another interconnect layer or, in the embodiment wherein the interconnect layer is a first level metal interconnect layer, a device layer. The interconnects are electrically connected to metal in the underlying layer. The trench is formed so that it overlies a metal interconnect in the underlying layer. The trench is formed through the dielectric thickness, so the metal in the underlying layer is at the bottom of the trench. The trench is formed using conventional lithographic techniques. The width of the trench is selected so that the subsequently formed bottom plate of the capacitor will contact the metal underlying the trench.

After the trench is formed, an insulating sidewall spacer is formed on the sides of the trench to protect against possible contact to other conductors and to ensure that the bottom plate of the capacitor is in electrical contact with the underlying metal interconnect. The insulating barrier layer is deposited by chemical vapor deposition. Examples of suitable barrier materials include silicon dioxide and silicon nitride. These materials are deposited by plasma enhanced chemical vapor deposition, followed by an etchback to form the sidewall spacers.

After the layer of barrier material is formed on the trench sidewalls, the bottom plate of the capacitor is formed. The bottom plate is formed by depositing a blanket layer of metal on the interconnect layer. The thickness of the layer is selected to ensure that, after anisotropically etching the metal layer to remove the metal from the horizontal surface of the dielectric layer, the metal that remains in the trench is in electrical contact with the metal at the bottom of the trench. One skilled in the art is able to select the trench width, sidewall spacer thickness and metal layer thickness required to meet this objective.

For example, the trench size is selected to provide sufficient surface area for the capacitor to hold an adequate amount of charge for the particular application. Since the objective of a trench capacitor is to provide a capacitor that has a large surface area without using a commensurate amount of wafer surface area, some of the trench capacitor surface area is in the direction of the trench walls. In order to meet this objective, the thicknesses of the bottom plate metal conductor layer and the capacitor dielectric layer are selected to ensure that the metal covers the sidewalls of the trench, but does not fill up the trench. This ensures that the capacitor dielectric and the top plate of the capacitor will also be deposited in the trench. One skilled in the art will appreciate that these thicknesses, within the parameters described above, are largely a matter of design choice. For example, one skilled in the art may select thicknesses that will provide a particular topography that is advantageous based upon downstream processing requirements.

The metal layer is then etched to remove the metal that is formed on the top, horizontal surface of the interconnect layer. The metal that remains in the trench after the etch has a tapered configuration. That is, the metal layer is thinner at the top of the trench than at the bottom of the trench. After the etch, the thickness of the metal layer at the bottom of the trench is such that it contacts the metal that underlies the trench.

Expedients for etching metal are well known to one skilled in the art. The selected etch expedient removes the metal anisotropically, to ensure that there is metal remaining on the trench sidewalls after the metal on the surface of the interconnect layer has been removed. Metal that remains in the bottom of the trench adds to the capacitor surface area.

A layer of dielectric material is then formed on the interconnect layer. Since the bottom plate of the capacitor is a metal instead of conductive polycrystalline silicon, suitable dielectric materials include metal oxides in addition to dielectric materials (e.g. silicon dioxide) that are compatible with polycrystalline silicon capacitor plates. One example of a suitable dielectric material is tantalum pentoxide ($Ta_2O_5$). The thickness of the $Ta_2O_5$ layer is chosen to provide a relatively high capacitance (i.e., a capacitance greater than 20 fF) per cell yet maintain a relatively low leakage current (i.e., a leakage current less than 10 fF) per cell. A 10 nm-thick $Ta_2O_5$ layer meets these objectives.

The dielectric layer is first passivated with a layer of barrier material. The dielectric layer is then patterned by selectively removing the dielectric materials and associated barrier from over the metal interconnects previously formed in the interconnect layer. The dielectric layer is patterned using conventional lithography in which a mask is formed on the structure. The mask is patterned such that only the regions of the dielectric that overlie the previously formed metal interconnects are exposed through the mask. Conventional expedients for removing dielectric materials (e.g. a plasma etch) are used to removed these portions of the dielectric layer. The mask is then removed.

The remainder of the top plate of the capacitor is then formed. The top plate of the capacitor is completed by depositing an additional layer of metal on the substrate. The additional material layer has a thickness chosen to protect the underlying dielectric layer (in this example, $Ta_2O_5$) during subsequent processing. The thickness is also selected to be compatible with other portions of the integrated circuit (e.g. the logic portion). The metal layer can actually be multiple layers (e.g. alternating layers of barrier materials and metal such as TiN/Ti/TiN/Al/TiN). The initial layers of TiN of this multilayer structure are selected to conform to the trench configuration. The upper layers (i.e. the Ti/TiN/Al/TiN layers) have a thickness selected to ensure that, when completely formed, the trench is entirely filled by the capacitor. The metal is patterned to form the top plate of the capacitor and the interconnect lines of the logic portion of the integrated circuit. The metal is patterned using conventional lithographic techniques well known to one skilled in the art. The present invention is advantageous because the capacitors are fabricated without disturbing the underlying active devices. Furthermore, the process of the present invention is advantageous because it integrates well with the process for masking the active devices underlying the capacitors.

DETAILED DESCRIPTION

Figure 1:
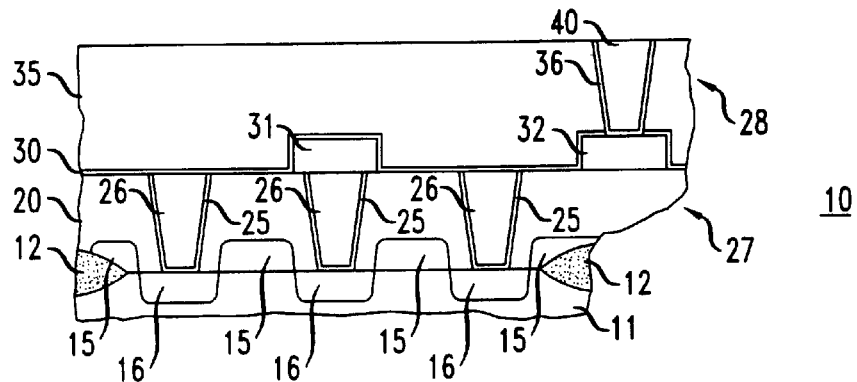
FIG. 1 is a cross-sectional view of a semiconductor device with a first level interconnect layer formed thereon before trench capacitors are formed therein.

The process of the present invention, in which trench capacitors are formed in an interconnect layer, is described with reference to FIGS. 1–3. Referring to FIG. 1, the illustrated device 10 is a DRAM device. The DRAM device is isolated from other regions in the semiconductor substrate 11 by field oxide regions 12. The DRAM device has a plurality of polycrystalline silicon gates 15 separated by conductive regions 16, which serve as the source and drain of the individual transistors in the device. A dielectric layer 20 is formed over the DRAM device. The dielectric layer has interconnects formed therein which are electrically connected to the conductive regions 16 in the substrate 11. These interconnects have a barrier layer 25 with metal 26 in the interior. Suitable barrier layer materials are well known to one skilled in the art. One example of a barrier layer is dual layer of titanium/titanium nitride with the titanium layer adjacent to the dielectric layer 20.

Tungsten is one example of a suitable metal 26. After the interconnect metal is deposited on the substrate, the interconnect metal layer is polished using chemical mechanical polishing. For convenience, this portion of the device 10 is referred to as the device active layer 27.

The first level interconnect layer 28 is formed over the device active layer 27. Conductive lines 31 are first formed over the interconnect layer 27. Conductive line 31 is a bit line for the DRAM device. Conductive line 32 is a standard conductor.

A thin dielectric layer 30 is next formed over the device active layer 27 with the conductive lines thereon. The thin dielectric layer 30 is a barrier layer between the metal and the $SiO_2$ layer 35, formed thereover. An interconnect consisting of a metal nitride (e.g. tungsten nitride) barrier layer 36 and metal 40 is formed in the layer of dielectric material 35. The metal 40 is in contact with standard conductor 32 by way of barrier 36.

After the metal 40 is deposited to form the interconnect, layer 28 is planarized before the trench capacitors are formed in layer 28. Chemical mechanical polishing (CMP) is one example of a suitable planarization expedient. This process strategy preserves the embedded logic devices and associated interconnect during the subsequent processing required to form the trench capacitors. Also, planarizing prior to trench formation decouples trench formation from the formation of the window in which interconnect 40 is formed. Also, by performing CMP before the trench are formed instead of after, the edge of the trench is less vulnerable to processing. Specifically, if the CMP is performed after some portion of the capacitor is formed in the trench, the material layers at the edge of the trench are vulnerable to overetch during the CMP. If one or more of these layers is completely etched away at the trench edge, the resulting capacitor will short out during use.

Figure 2:
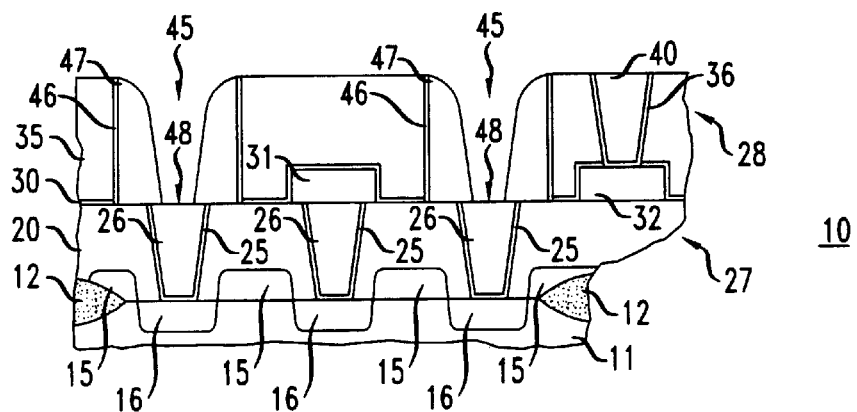
FIGS. 2 and 3 are cross-sectional views of a semiconductor device with a first level interconnect layer formed thereon in which trench capacitors are being formed according to the process of the present invention.

Referring to FIG. 2, trench capacitors are formed by etching trenches in the interconnect layer. The trenches 45 are defined in the interconnect layer 28 using conventional lithography in which an energy-definable mask material is formed on layer 28 and patterned. The resulting patterned mask defines the trench regions, which are the regions of the layer 28 that are exposed through the mask (not shown). The trenches are defined in layer 28 by subjecting the masked structure to an etchant that removes the portion of the layer 28 underlying the mask. The etch proceeds to expose the metal 26 in the underlying device layer 27. The basic structure of the trench is exemplary and not intended to be limiting. In the embodiment illustrated in FIG. 2, the trench is formed to provide a connection between the capacitor and the lower metal 26. In this case, the trench opening in interconnect layer 28 is referred to as a window. However, alternate configurations are contemplated. For example, the connection between the capacitor and the lower metal could be side-to-side instead of the top-bottom relationship illustrated in FIG. 2.

The trench dimensions are selected to ensure that the subsequently formed bottom plate of the capacitor will be in electrical contact with the underlying metal 26. The trench width is also selected to ensure that the appropriate thickness between the portions of the capacitor bottom plate formed on the trench 45 sidewalls is obtained. The trench 45 width is also selected so that a portion of the top plate 60 (FIG. 3) extends into the trench 45. The length of the trench is largely a matter of design choice. In one embodiment, a trench width of 0.28 $\mu$m is selected. The insulating barrier layer 46 is then deposited and the capacitor bottom plate 47 formed.

The distance between the vertical portions of capacitor bottom plate 47 on the sidewalls of the trench 45 is about 0.2 $\mu$m.

The barrier layer 46 is a layer of $SiO_2$ or other electrically insulating material. Barrier layer 46 prevents shorting between the capacitor lower plate and the metal lines. The barrier layer 46 also serves as a barrier to the diffusion of metal into the adjacent dielectric material. The $SiO_2$ barrier layer is formed by depositing a layer of TEOS over the interconnect layer 28. The interconnect layer 28 is then etched anisotropically using conventional plasma etching expedients for forming spacers for a polycrystalline silicon gate in semiconductor device fabrication. The plasma etch stops when the portions of the barrier layer 46 on the surface of interconnect layer 28 and the metal layer 40 are exposed and the bottom of the trench 45 is removed. The barrier layer is thin (e.g. on the order of 10 nm) and the required thickness is the thickness needed to provide an effective diffusion barrier. The thickness of barrier layer 46 is also selected to insulate the trench capacitor from nearby bit lines 31. The thickness of barrier layer 46 is also selected to ensure that the bottom plate 47 extends far enough into the trench 45 to contact the underlying interconnect 26. The surface of the metal plug 26 that underlies the trench 45 is not covered by the diffusion barrier layer 46.

The bottom plate 47 of the capacitor is then formed. The bottom plate is formed by depositing a layer of metal (e.g. titanium/titanium nitride) on the surface of the interconnect layer 28. The metal is removed from the surface of the interconnect layer (and from the interior portions of trench 45) using a conventional anisotropic etch expedient. The portion of the metal layer that remains after the etch is along the sidewalls and bottom of the trench 45. The thickness of the bottom plate 47 on the sidewalls is such that there is space remaining in the trench. In the example wherein the trench width is 0.28 $\mu$m and the barrier layer is 10 nm, the thickness of the bottom plate on the sidewalls is 30 nm. In this example, the distance between the bottom plate on the sidewalls is about 0.2 $\mu$m. Forming the bottom plate of the capacitor in this manner is simpler than prior art techniques because no lithography is required.

Figure 3:
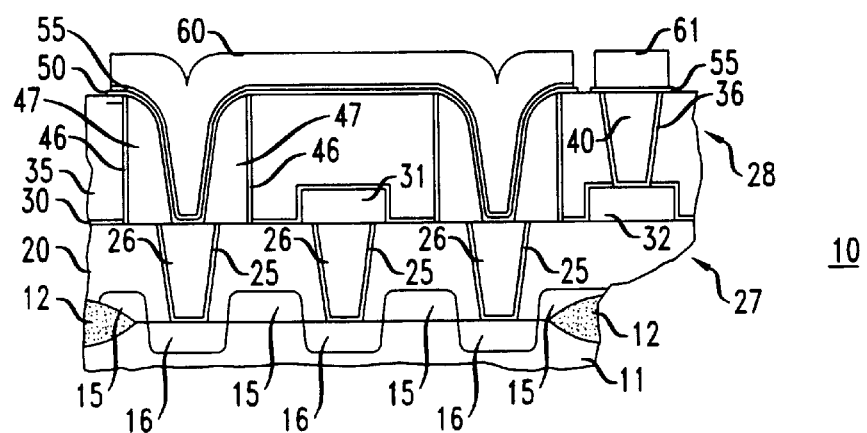

Referring to FIG. 3, a layer of dielectric material 50 is formed on the interconnect layer 28. It is advantageous if the dielectric material has a high dielectric constant (e.g. $Ta_2O_5$). The layer of dielectric material 50 is patterned. In FIG. 3, the dielectric layer 50 is sandwiched between the bottom plate 47 and the top plate 60 of the capacitor. The thickness of the dielectric layer is largely a matter of design choice. However, the thickness is selected so that a portion of the subsequently formed top plate 60 extends into trench 45.

A barrier layer 55 is then formed over the dielectric layer. The barrier layer 55 acts as a barrier to the diffusion of metal from the capacitor top plate 60 into the dielectric layer 50. One example of a suitable barrier material is titanium nitride. Again, the thickness of the barrier layer is selected to ensure that a portion of the subsequently formed top plate (and associated barrier layers) extends into the trench 45. In the embodiment illustrated in FIG. 3, the top plate 60 is patterned so that top plate 60 remains over the metal plug 40 in interconnect layer 28.

Figure 4:
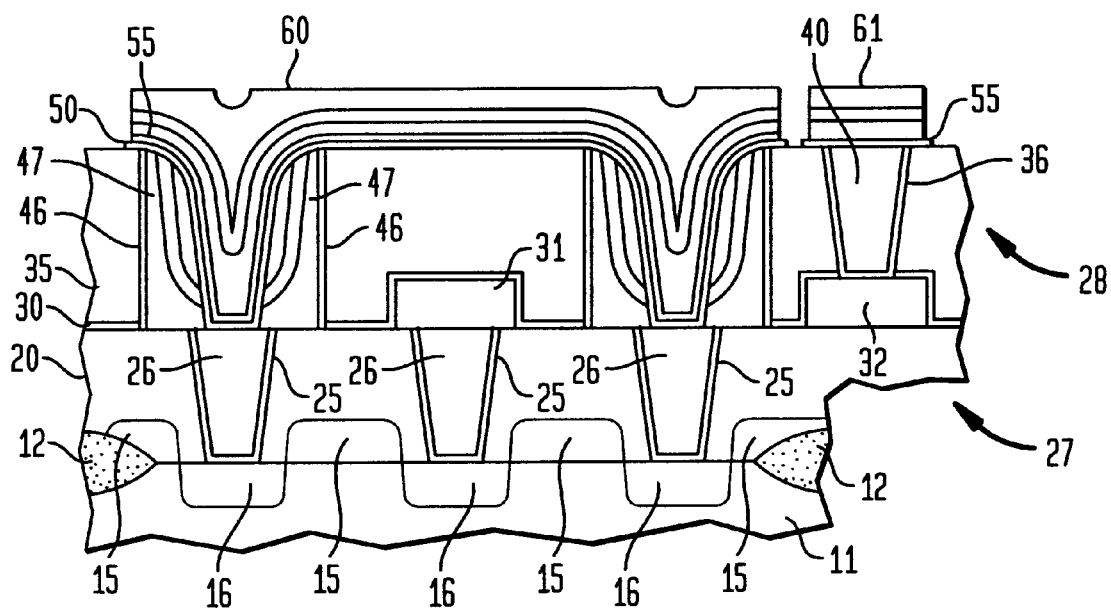
FIG. 4 is the device depicted in FIG. 3, wherein the top and bottom capacitor plates have two layer of metal.

The top plate 60 is then formed by depositing a metal (e.g., copper, aluminum, etc.) on the interconnect layer 28. As previously noted, the top plate can be more than one layer of metal. An embodiment of the present invention wherein the bottom plate 47 and top plate 60 consist of a metal stack is depicted in FIG. 4. In this embodiment, bottom plate 47 and top plate 60 consist of two metal layers with a barrier layer sandwiched in between. In the embodiment wherein the top plate 60 is a metal stack, barrier layers are formed between the individual metal layers, where appropriate. The top plate extends into the cavity 45, thereby providing the desired capacitor surface area. The top plate is then patterned using conventional lithographic techniques. In the embodiment depicted in FIG. 3, the metal layer is also patterned to form an interconnect line 61.

What is claimed is:

1. A semiconductor device comprising:
    a semiconductor substrate with an active device region formed thereon;
    at least one layer of dielectric material formed on the device active region;
    a metal interconnect region formed over the device active region; and
    a layer of dielectric material on the metal interconnect region, the layer of dielectric material having a trench therein, wherein the bottom of the trench communicates with the metal interconnect region, wherein sidewall spacers of an insulating barrier material and a metal forming the capacitor bottom plate are inside the trench and the capacitor bottom plate decreases in thickness as the capacitor bottom plate extends upward in the trench and wherein a capacitor is formed in the trench, the capacitor comprising the bottom plate, a capacitor dielectric, and a capacitor top plate, wherein at least a portion of the capacitor dielectric and the capacitor top plate are between the sidewall spacers in the trench.

2. The device of claim 1 wherein the insulating barrier material is selected from the group consisting of silicon nitride and silicon dioxide.

3. The device of claim 1 wherein the capacitor dielectric material is selected from the group consisting of silicon nitride, silicon dioxide and metal oxides.

4. The device of claim 3 wherein the metal oxide is tantalum pentoxide.

5. The device of claim 1 wherein the capacitor top electrode is a layer of barrier material.

6. The device of claim 5 wherein the barrier material is titanium nitride.

7. The device of claim 1 wherein the capacitor top plate is a multilayer structure.

8. The device of claim 7 wherein the capacitor top plate has at least one metal layer on which is formed a layer of barrier material.

9. The device of claim 1 wherein the bottom plate of the capacitor is a multilayer structure comprising a first layer of barrier material over which is formed a layer of metal.

* * * * *